United States Patent
Ciarlini et al.

(10) Patent No.: US 10,133,551 B1
(45) Date of Patent: Nov. 20, 2018

(54) CONTENT-AWARE COMPRESSION OF DATA USING MULTIPLE PARALLEL PREDICTION FUNCTIONS

(71) Applicant: EMC IP Holding Company LLC, Hopkinton, MA (US)

(72) Inventors: Angelo E. M. Ciarlini, Rio de Janeiro (BR); Alex Laier Bordignon, Niteroi (BR); Rômulo Teixeira de Abreu Pinho, Niteroi (BR); Marcello Luiz Rodrigues de Campos, Niteroi (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 222 days.

(21) Appl. No.: 15/080,751

(22) Filed: Mar. 25, 2016

(51) Int. Cl.
*G06F 7/483* (2006.01)
*H03M 7/30* (2006.01)

(52) U.S. Cl.
CPC .............. *G06F 7/483* (2013.01); *H03M 7/30* (2013.01)

(58) Field of Classification Search
None
See application file for complete search history.

(56) References Cited

U.S. PATENT DOCUMENTS

2015/0341653 A1* 11/2015 Ostrovskiy ............ H04N 19/50
382/190

OTHER PUBLICATIONS

Elias, P., "Universal codeword sets and representations of the integers," Information Theory, IEEE Transactions on, vol. 21, No. 2, pp. 194-203, Mar. 1975.
(Continued)

*Primary Examiner* — Michael D. Yaary
(74) *Attorney, Agent, or Firm* — Ryan, Mason & Lewis, LLP

(57) ABSTRACT

Multiple parallel prediction functions are employed for content-aware data compression. An exemplary method comprises obtaining a floating point number comprising a sign, an exponent at a given base and a significand having a length; applying a plurality of distinct prediction algorithms to the floating point number to generate a corresponding plurality of predictions; selecting a given one of the plurality of distinct prediction algorithms for the floating point number by evaluating a compression metric applied to the plurality of predictions; and encoding the floating point number by encoding the exponent and the length as a single code using a residual generated by the selected prediction algorithm. A disambiguation index optionally identifies the selected prediction algorithm among a set of prediction algorithms that potentially generated the selected prediction. A set of one or more predictors out of a larger set of predictors can be determined for a specific data set based on a performance-based ranking.

22 Claims, 5 Drawing Sheets

(56) References Cited

OTHER PUBLICATIONS

U.S. Appl. No. 14/230,510, filed Mar. 31, 2014, entitled "Heteroscedastic Data Compression Using Arima-Garch Model Estimation."
U.S. Appl. No. 14/579,130, filed Dec. 22, 2014, entitled "Content-Aware Lossless Compression and Decompression of Floating Point Data."
U.S. Appl. No. 14/749,826, filed Jun. 25, 2015, entitled "Random Access to Compressed Data Using Bitwise Indices."
U.S. Appl. No. 14/867,329, filed Sep. 28, 2015, entitled "Distributed Content-Aware Compression and Decompression of Data."
G. Mandyam et al., "Lossless Seismic Data Compression Using Adaptive Linear Prediction," in Geoscience and Remote Sensing Symposium, 1996.

* cited by examiner

FIG. 4A
400

Compress($s_i$):

a. For each predictor $P_j(s_i)$, $j = 1..N$ i. $r_{ij} = P_j(s_i) - s_i$ b. $b = \text{argmin } M_{ij}(r_{ij})$, $j = 1..N$ c. $\Pi_i = \{b\}$ d. For each predictor $P_k(s_i)$, $k = 1..N$, $k \neq b$ i. Assume $r_{ik} = r_{ib}$ ii. $\hat{s}_i = P_k(s_i) + r_{ik}$ iii. If $(M_{il}(r_{il}) \geq M_{ik}(r_{ik}), \forall l \neq k, l \neq b)$ then $\Pi_i = \Pi_i \cup \{k\}$ e. $nb = \lceil \log_2 |\Pi_i| \rceil$ f. If $nb > 0$, then i. Store the index $m$ of the best predictor in the ordered set $\Pi_i$, with $nb$ bits g. CompressAndStore($r_{ij}$)

450

Decompress($r_i$)

a. ReadAndDecompress($r_i$)

b. $\Pi_i = \emptyset$ c. For each predictor $P_k(s_i)$, $k = 1..N$ i. Assume $r_{ik} = r_i$ ii. $\hat{s}_i = P_k(s_i) + r_{ik}$ iii. If $(M_{il}(\hat{r}_{il}) \geq M_{ik}(r_{ik}), \forall l \neq k)$ then $\Pi_i = \Pi_i \cup \{k\}$ d. $nb = \lceil \log_2 |\Pi_i| \rceil; m = 0$ e. If $nb > 0$, then i. Read the index $m$ of the best predictor in the ordered set $\Pi_i$, with $nb$ bits f. $s_i = P_m(s_i) + r_{ik}$

CONTENT-AWARE COMPRESSION OF DATA USING MULTIPLE PARALLEL PREDICTION FUNCTIONS

CROSS-REFERENCE TO RELATED APPLICATIONS

The present application is related to U.S. patent application Ser. No. 14/579,130, filed Dec. 22, 2014, now U.S. Pat. No. 9,660,666, entitled "Content-Aware Lossless Compression and Decompression of Floating Point Data;" U.S. patent application Ser. No. 14/749,826, filed Jun. 25, 2015, now U.S. Pat. No. 9,503,123, entitled "Random Access to Compressed Data Using Bitwise Indices;" and U.S. patent application Ser. No. 14/867,329, filed Sep. 28, 2015, entitled "Distributed Content-Aware Compression and Decompression of Data," each incorporated by reference herein.

FIELD

The field relates generally to compression and decompression of signal data, such as seismic data.

BACKGROUND

Data compression techniques are commonly used to achieve a low bit rate in the digital representation of signals for efficient processing, transmission, and storage. The size of seismic datasets, for example, continues to increase due to the need of extracting oil from more complex geologies. This drives demand for better sensor acquisition technologies, higher resolution hydrocarbon models, more iterations of analysis cycles, and increased integration of a broader variety of data types, all of which contributes to generating more and more data. Thus, seismic data compression has become important in geophysical applications, for efficient processing, storage and transmission of seismic data.

A number of techniques have been proposed for efficient lossless compression of seismic data. U.S. patent application Ser. No. 14/579,130, filed Dec. 22, 2014, now U.S. Pat. No. 9,660,666, entitled "Content-Aware Lossless Compression and Decompression of Floating Point Data," for example, discloses techniques for content-aware lossless compression and decompression of floating point data, such as seismic data, and other data. The disclosed content-aware lossless compression algorithms employ observed phenomena in the data to obtain improved compression ratios and processing speeds, relative to conventional techniques.

Nonetheless, a need remains for improved compression and decompression techniques.

SUMMARY

Illustrative embodiments of the present invention provide methods and apparatus for content-aware compression of data using multiple parallel prediction functions. In one exemplary embodiment, a method for compressing at least one floating point number comprises obtaining the at least one floating point number represented using one or more bits to indicate a sign of the at least one floating point number and one or more additional bits to indicate an exponent at a given base and a significand of the at least one floating point number, wherein the significand has a length equal to a number of bits between a most significant bit of the significand and a least significant bit of the significand having a predefined binary value; applying a plurality of distinct prediction algorithms to the at least one floating point number to generate a corresponding plurality of predictions; selecting a given one of the plurality of distinct prediction algorithms for the at least one floating point number by evaluating a compression metric applied to the plurality of predictions; and encoding the at least one floating point number by encoding the exponent and the length as a single code using a residual generated by the selected prediction algorithm.

In one or more embodiments, an indication of the selected prediction algorithm is stored with the compressed values. The indication comprises, for example, a disambiguation index identifying the selected prediction algorithm among a set of potential prediction algorithms that potentially generated the selected prediction. The compressed given floating point number can be decompressed by restoring discarded bits based on the encoded length and the stored indication.

In at least one exemplary embodiment, a set of one or more predictors out of a larger set of predictors is determined for a specific data set including the at least one floating point number based on a performance-based ranking. The set of one or more predictors can be selected, for example, for a segment of the data set including the at least one floating point number. The data set can be segmented based on one or more of a local variance, a local average, a local measure of smoothness and a local auto-correlation.

Advantageously, illustrative embodiments of the invention provide improved compression and decompression of data, such as seismic data. These and other features and advantages of the present invention will become more readily apparent from the accompanying drawings and the following detailed description.

BRIEF DESCRIPTION OF THE DRAWINGS

FIGS. 4A and 4B illustrate pseudo code for exemplary implementations of a compression process and decompression process, respectively, each employing a disambiguation technique according to an embodiment of the invention; and FIG. 5 is a system diagram of an exemplary computer system on which at least one embodiment of the invention can be implemented.

DETAILED DESCRIPTION

Figure 1:
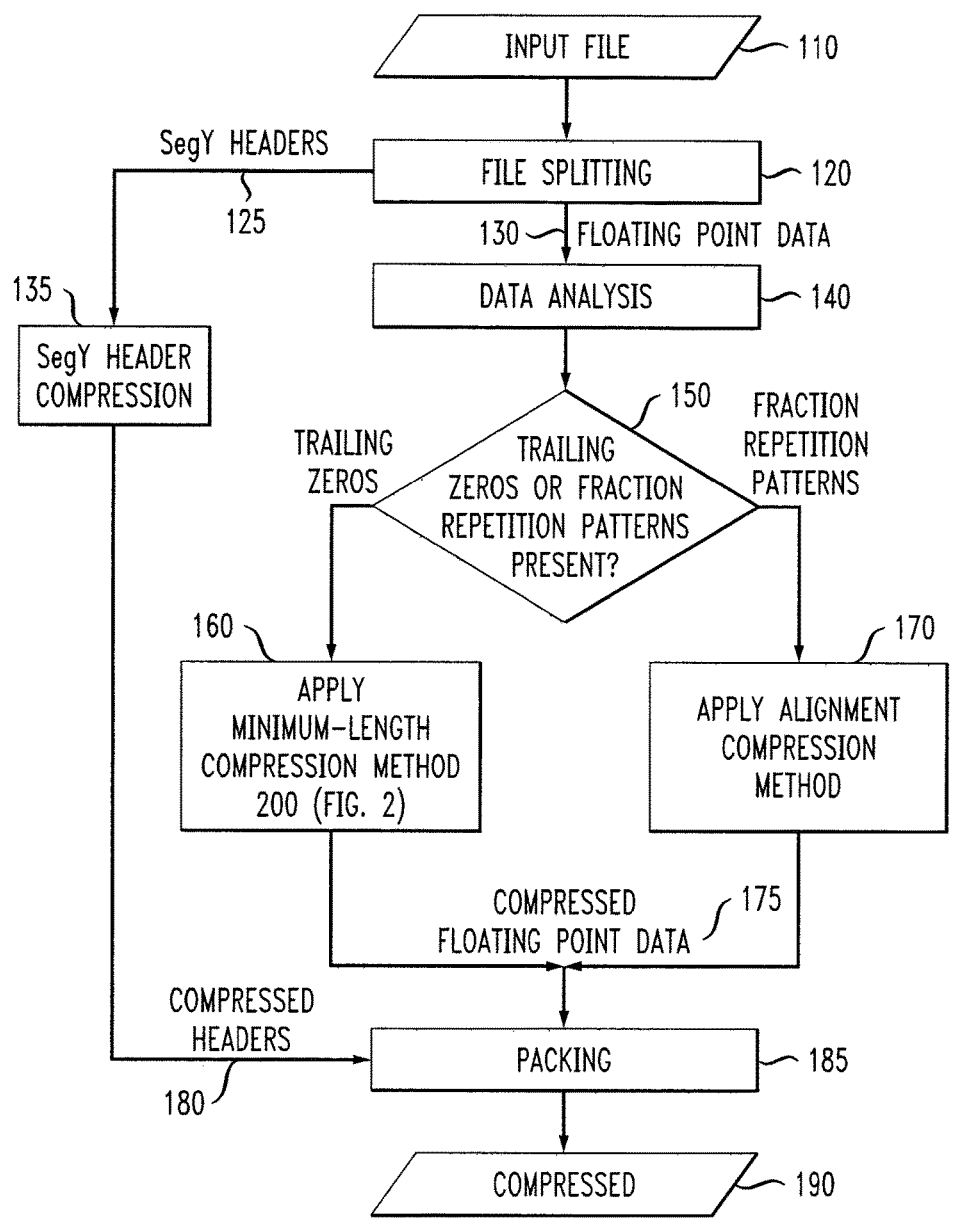
FIG. 1 is a flow chart illustrating an exemplary implementation of a data compression process.

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for content-aware compression and decompression of data. While the exemplary embodiments are described herein using seismic data, aspects of the present invention can be applied to other forms of data, as would be apparent to a person of ordinary skill in the art based on the present disclosure.

In at least one exemplary embodiment, the disclosed content-aware compression techniques are based on exemplary data compression algorithms, referred to herein as content-aware lossless compression algorithms, introduced in U.S. patent application Ser. No. 14/579,130, filed Dec. 22, 2014, now U.S. Pat. No. 9,660,666, entitled "Content-Aware Lossless Compression and Decompression of Floating Point Data," incorporated by reference herein. The exemplary content-aware lossless compression algorithms provide a data oriented method for substantially lossless compression of floating point data, such as seismic data, and other data that employs observed phenomena in the data to obtain high compression ratios with fast algorithms. These data compression algorithms are modified as described herein to provide distributed content-aware lossless compression algorithms.

The exemplary content-aware lossless compression algorithms comprise a minimal-length compression technique, discussed further below in conjunction with FIG. 2. The minimal-length compression technique classifies the samples so that codes describing both the exponent and the length of the significand can be used to keep only the necessary bits to represent each sample. The disclosed content-aware lossless compression algorithms are optionally combined with prediction models that aim at reducing the entropy of the data. A data analysis step is employed to decide which content-aware lossless compression algorithm is the best for each input dataset, as discussed further below in conjunction with FIG. 1. The minimal-length compression technique further provides versions for fast compression and decompression (Turbo Version) or for maximum compression (Max Version).

One or more embodiments of the invention provide improved and efficient, content-aware compression and decompression of floating point data (e.g., seismic data) using prediction mechanisms. The aim is to compress the residual, or error, of the prediction of each time series sample, instead of the sample value itself, since good predictors tend to yield very small errors, which usually require fewer bits to be represented. In at least one embodiment, discussed further below, a plurality of predictors are employed in parallel in the max version of the minimal-length compression technique.

In one or more embodiments, the efficiency of the minimal-length compression process is improved, relative to the techniques described, for example, in U.S. patent application Ser. No. 14/579,130, now U.S. Pat. No. 9,660,666, entitled "Content-Aware Lossless Compression and Decompression of Floating Point Data," by employing data segmentation and combinations of multiple predictors in order to improve the predictions on a sample-by-sample level, with substantially minimal bookkeeping.

While the exemplary embodiments employ the content-aware lossless compression algorithms as the compression algorithm, alternate compression algorithms, such as Huffman coding and Lempel-Ziv coding, or variations thereof, can be employed, as would be apparent to a person of ordinary skill in the art.

Content-Aware Lossless Compression Algorithms

FIG. 1 is a flow chart illustrating an exemplary implementation of a data compression process 100. The exemplary data compression process 100 processes seismic data stored in SegY files. Compression of other kinds of floating point data can be adapted from the exemplary embodiment, as would be apparent to a person of ordinary skill in the art. Overall, an input file 110 is split into SegY headers 125 and floating point data values 130 at a file splitting stage 120. The SegY headers 125 are compressed during step 135, for example, with standard entropy encoders or with content-aware compression techniques, such as the techniques disclosed in U.S. patent application Ser. No. 14/867,329, filed Sep. 28, 2015, entitled "Distributed Content-Aware Compression and Decompression of Data."

The floating point data values 130 are processed during step 140 to determine which compression technique 200 is the best for the input file 110, and will follow one of two possible workflows. The data analysis 140 can be carried out on random, small subsets of the input file 110. Statistics on the length of significands of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to maximize performance.

A test is performed during step 150 to determine if trailing zeros or fraction repetition patterns are present in the input file 110. If it is determined during step 150 that trailing zeros are present, then program control proceeds to step 160 for compression using the minimum-length compression method 200 (FIG. 2) to process floating point data that can be trimmed. If, however, it is determined during step 150 that fraction repetition patterns are present, then program control proceeds to step 170 for compression using an exemplary alignment compression method. As discussed further below in conjunction with FIG. 2, the minimum-length compression method 200 can optionally be tuned for turbo or maximal compression.

Finally, compressed floating point data values 175 and compressed headers 180 are applied to a packing module during step 185, which organizes the compressed floating point data values 175 and compressed headers 180 in one or more compressed files 190 for access by a decompressor.

The algorithms for decompressing the compressed data are straightforward to a person of ordinary skill in the art, based on the discussion of the compression algorithms provided herein. The execution times of the decompression algorithms vary between 50% and 100% of the compression times. Thus, the remaining discussion focuses primarily on the description of the compression algorithms.

Min-Length Compression

Generally, as noted above, the minimal-length compression method 200 achieves fast compression through the efficient removal of trailing zeros from the least significant part of the significand of floating-point seismic samples. The algorithm exploits correlations between the exponents and the length of the significands of samples, which is the number of bits from the highest bit of the significand to the least significant bit 1 that precedes the trailing sequence of zeros. A cumulative histogram of classes represented by {exponent, length} classes is built and used to select those classes that will give the best compromise between bookkeeping and bit savings. Classes that are not initially part of the selected best classes are grouped and compete with the selected classes so that the best combination of individual classes and groups is obtained. The compression is performed in two steps through the data. In the first, the statistics about the samples are gathered and the classes and groups are formed and selected. In the second step, the samples are classified and encoded according to the classes' specifications.

As discussed hereinafter, the exemplary minimum-length compression method 200 depends on a user-defined parameter, N>0, which is a superior limit for the number of output {exponent, length} classes. For each input sample, the method 200 writes to the compressed stream 1 bit to represent the sign of the sample, $\lceil \log_2 N \rceil$ bits for the class code associated with the sample, and a certain number of bits for the sample's significand, associated with the length derived from the sample's class.

Figure 2:
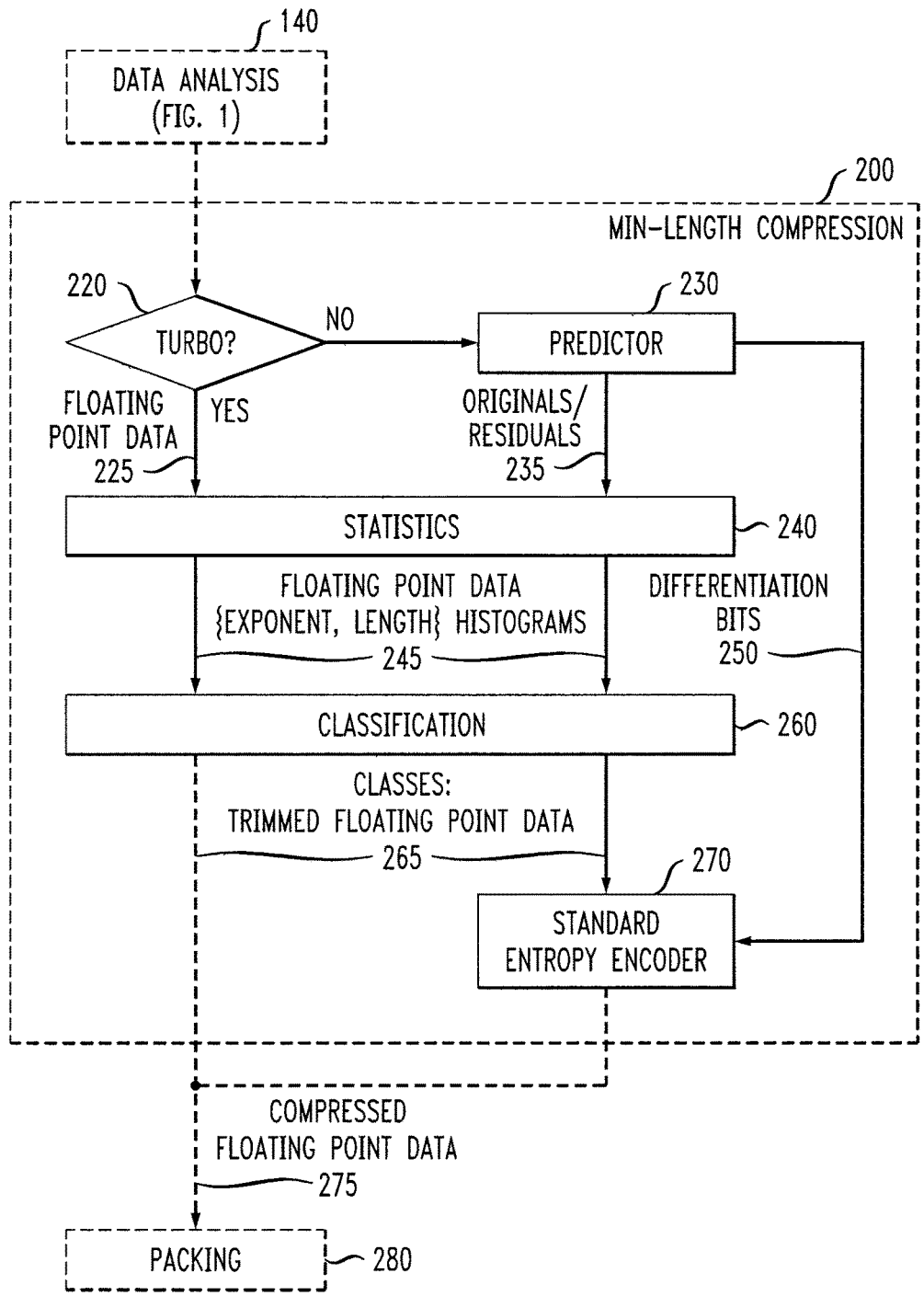
FIG. 2 is a flow chart illustrating an exemplary implementation of a minimum-length compression method.

FIG. 2 is a flow chart illustrating an exemplary implementation of the minimum-length compression method 200. As previously indicated, the exemplary minimum-length compression method 200 compresses the input file 110 by removing unnecessary trailing zeros from significands. If zeros are removed from the original data, this information needs to be stored so that the original number can be rebuilt in the decompression phase, without data loss. Bookkeeping for such information for every sample can be costly and may result in poor compression performance. The exemplary minimum-length compression method 200 balances the removal of zeros and the bookkeeping. As discussed above, the minimum-length compression method 200 can optionally be tuned for turbo or maximal compression.

Thus, a test is performed during step 220 to determine if a turbo compression or a maximal compression will be performed. If it is determined during step 220 that a turbo compression will be performed, then program control proceeds directly to step 240 to process the floating point data 225.

The exemplary minimum-length compression method 200 works in two passes through the data. In the first pass, statistics on the lengths of the significands and their correlation with the corresponding exponents are gathered during step 240. The length of a significand is defined as the number of bits from the bit of highest order to the lowest order bit one preceding the sequence of trailing zeros. Every {exponent, length} pair is defined as a class and the statistics indicate how many bits can be saved if a specific code is created for that class and the trailing zeros of the significand of the samples of that class are removed. The output of the statistics phase 240 is a collection of histograms 245 of {exponent, length} pairs.

Given a (configurable) superior limit, N>0, to the number of classes to be represented, the exemplary minimum-length compression method 200 carries out a second pass through the input file 110 during step 260, removing zeros from samples of those classes in the histogram data 245 that will yield the best compression ratios in the trimmed floating point data 265. The referred superior limit N determines how many bits are necessary to store class codes associated with {exponent, length} pairs. The remaining classes are optionally grouped so that the highest number of zeros can be removed with the least amount of bookkeeping.

For classes associated with {exponent, length} pairs, let $B_c = \lceil \log_e N \rceil$ be the number of bits necessary to store class codes, $B_s=1$ be the number of bits to store the sign of the floating point number, and $B_l$=length be the number of bits to store its significand. The classification of the samples during step 260 creates six types of classes:

Classes that represent a single exponent and a single length: in this case, for each sample, $[B_s+B_c+(B_l-1)]$ bits are stored, since the least significant bit of the significand is known to be 1 and, as such, does not need to be stored.

Classes that represent, for a single exponent, all lengths equal to or less than the length representative of the class: in this case, $[B_s+B_c+B_l]$ bits are stored for each sample (note that the least significant bit needs to be stored).

Classes that combine consecutive exponents that can be aligned, having a maximum length: in this case, $[B_s+B_c+B_l+1]$ bits are stored. Notice that the most significant bit 1 of the significand, which is hidden in the IEEE 754 format, has to be explicitly represented when numbers having different exponents are mixed, so that the alignment can be reverted upon decompression.

Classes that combine pairs of exponents that have different lengths: in this case, each sample can be represented by one extra bit that distinguishes the case of one exponent from the other and the corresponding length minus one bit, since we do not need to store the least significant bit. Thus, $[B_s+B_c+B_l]$ bits are stored for each sample of these classes.

Classes that combine exponents that only have associated lengths of zero or one bit: in this case, no bits of the significand are stored, only a code with $B_z = \lceil \log_2 N_z \rceil$ bits (wherein $N_z$ is the total number of zero-length classes), which will enable the reconstruction of the class at the decompression time. Consequently, $[B_s+B_c+B_z]$ bits are stored.

Classes that handle exceptions: the IEEE 754 format specifies special binary codes for numbers that cannot be represented (also known as "not-a-number", or NaN). These are stored as members of the zero-length classes, in their original form (i.e., with 32 bits), with $[B_s+B_c+B_z+32]$ bits in total.

The size of the code is a (configurable) parameter of the minimum-length compression method 200, which may be defined as either 5 or 6 bits, for example.

If it is determined during step 220 that a maximal compression will be performed, then a prediction is performed during step 230, before program control proceeds to step 240 to process the original values and residual values 235. The variation of the minimum-length compression method 200 for maximum compression works in a similar manner as the turbo version described above. The difference is that a linear prediction algorithm is employed during step 230 to predict the value of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); G. Mandyam et al., "Lossless Seismic Data Compression Using Adaptive Linear Prediction," in Geoscience and Remote Sensing Symposium (1996); or U.S. patent application Ser. No. 14/230,510, filed Mar. 31, 2014, now U.S. Pat. No. 9,858,311, entitled "Heteroscedastic Data Compression Using Arima-Garch Model Estimation," each incorporated by reference herein.

Generally, a linear prediction algorithm is employed during step 230 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression. Adaptive linear prediction (in which prediction coefficients are updated with the execution of the algorithm) provides a good compromise between prediction power and speed of execution.

In the case of floating point data, the residual could have a longer length, even if its absolute value is lower than that of the original value. To ensure that the residual values demand fewer bits than the original values, the following strategy is adopted in the exemplary embodiment:

During compression, the prediction and the original value are aligned to the same exponent, and the prediction is truncated at the bit that precedes the least significant bit 1 of the original value. By doing this, the least significant bit of the residual will be the least significant bit 1 of the original value when they are aligned. If the absolute value of the residual is lower than that of the original value, its length is equal to or shorter than that of the original value when the exponents are restored.

During decompression, the residual value is aligned with the prediction (which is the same prediction originated at compression time) and the prediction is truncated at the bit that precedes the least significant bit 1 of the residual. The residual is then added to the prediction in order to exactly obtain the original value.

On average, it has been observed that residuals are indeed "shorter" than the original data samples. In order to maximize the compression ratios even further, the residual is replaced with the original sample whenever the former needs, in reality, more bits to be represented. Only one bit of bookkeeping, referred to in FIG. 2 as a differentiation bit 250, is necessary to differentiate between the two types, therefore with minimal impact. As the frequency in which residuals are longer than the original values is low, the compression of this differentiation bit 250 is very high, so that this differentiation tends to increase compression ratio.

In the maximum compression mode, the class codes and trimmed floating point data 265 generated by the classification 260 and the differentiation bits 250 are further processed using an entropy encoder 270, in a known manner.

Finally, compressed floating point data values 275 are applied to a packing module during step 280, which organizes the compressed floating point data values 275 in one or more compressed files for access by a decompressor.

While the exemplary content-aware lossless compression algorithms disclosed in U.S. patent application Ser. No. 14/579,130, now U.S. Pat. No. 9,660,666, entitled "Content-Aware Lossless Compression and Decompression of Floating Point Data," demonstrate excellent compression efficiency (i.e., compression ratio relative to compression speed) for seismic data containing sequences of trailing zeros, it can be shown that the compression efficiency can be further improved with more refined choices of parameters, data manipulation, and/or use of predictors. The overall challenge is how to integrate these features with the existing algorithms in such way as to not impact the efficiency figures already obtained.

Further Improving Compression Ratios Using Multiple Predictors

As noted above, one or more embodiments of the invention achieve improved compression ratios in substantially lossless compression of floating-point data (e.g., seismic data), using prediction mechanisms. Such mechanisms interpret the floating-point numbers in seismic data as time series and employ methods to predict the value of a sample based on the values of past samples. In the end, the residual (or error) of the prediction is compressed, instead of the original time series value. The general intuition is that a good predictor yields very small errors, which in turn require fewer bits to be represented, reducing the overall entropy of the data to be compressed.

In one or more embodiments, the efficiency of the minimal-length compression process is improved, relative to the techniques described in U.S. patent application Ser. No. 14/579,130, now U.S. Pat. No. 9,660,666 entitled "Content-Aware Lossless Compression and Decompression of Floating Point Data." One or more aspects of the invention improve the efficiency using the choice of parameters and/or additional steps that can be incorporated into the minimal-length compression to achieve higher compression ratios at low computational cost.

According to one aspect of the invention, multiple predictors are employed, substantially in parallel, to predict the value of the current sample of a time series, choosing the best prediction for each specific sample, and employing a logical disambiguation criterion in order to substantially reduce the bookkeeping necessary to inform which predictor was used for each sample.

According to another aspect of the invention, in one or more embodiments, the floating point data is segmented into ranges of local variances, and one predictor or a set of them is selected for each range, based on correlations between prediction quality and variance ranges.

As noted above, for the maximum compression version of the minimum-length compression method 200 a linear prediction algorithm, such as Recursive Least Squares (RLS), is employed during step 230 to predict the value of every data sample based on a sequence of previous samples.

Generally, the RLS algorithm is based on three parameters, $\lambda$, $\delta$, p, which control how fast the algorithm "learns" the behavior of the time series. The parameter $\lambda$ is a forgetting factor, which determines the influence of each past sample in the prediction of the current sample, and is usually in the interval [0.9, 1]. The parameter S is a numerical regulator used in the initialization of the algorithm, and is used to maintain numerical stability. The parameter p is an order the predictor, and determines how many past samples will be used to predict the current sample.

During compression, a prediction $P(s_i)$ is generated for each sample $s_i$ of the dataset, and the residual $r_i=P(s_i)-s_i$ is calculated. The residual, in turn, is encoded by the minimum-length compression method 200, discussed above, and stored in a compressed format. During decompression, the compressed residual is read and decoded. The prediction $P(s_i)$ generated at the compression phase is generated again, based on past decompressed samples. The original sample is finally obtained without loss as $s_i=P(s_i)+r_i$.

When seismic data files includes a high percentage of samples comprising mantissas that lack the referred pattern of "trailing zeros," the ability to achieve high compression ratios largely depends on the ability to predict the value of each sample.

It has been found that when choosing the best predictor, on average, for the entire seismic data, other candidate predictors were much better in many parts of the data. Thus, to substantially optimize the prediction, it would be necessary to find a way to encode what predictor to use in each part. This is costly because a lot of bits are required to indicate which predictor was used to the decompressor.

If different predictions are employed across the seismic trace, the dataset must be segmented and the information stored so that the decompressor knows how the data was segmented and which predictor was used in which segment.

The best predictor, however, may change at each sample. Therefore, to further increase the prediction power, an indication is required to the decompressor indicating which predictor to use for each sample.

Figure 3:
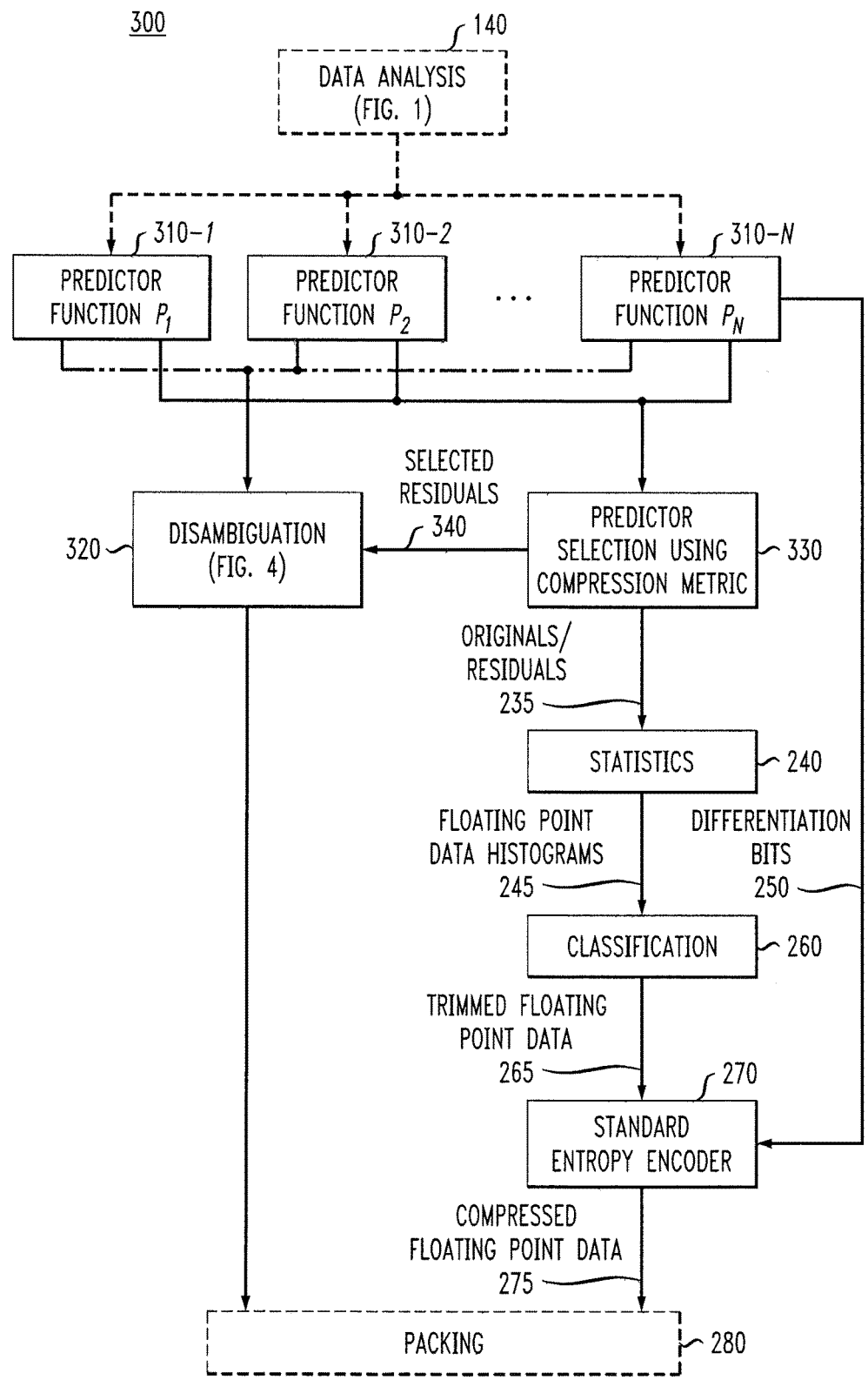
FIG. 3 is a flow chart illustrating an exemplary implementation of a process for the max version of the minimal-length compression method of FIG. 2 in accordance with a multiple predictor embodiment of the invention.

FIG. 3 is a flow chart illustrating an exemplary implementation of a process 300 for the max version of the minimal-length compression method of FIG. 2 in accordance with a multiple predictor embodiment of the invention. As discussed above in conjunction with FIG. 1, the floating point data values 130 are processed during step 140 to determine which compression technique 200 is the best for the input file 110, and will follow one of two possible workflows. The data analysis 140 can be carried out on random, small subsets of the input file 110. Statistics on the length of significands of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to maximize performance.

In one or more embodiments, the particular predictors are chosen after an analysis of a statistically significant portion of the data to be compressed. Thus, a pre-processing step is optionally performed during step 140 to select the best predictors to use for the data set, as discussed further below in a section entitled "Best Combination of Predictors."

During step 310, a plurality of predictor functions, $P_1$ through $P_N$, are applied to the floating point data values 130, substantially in parallel. A prediction selection is performed during step 330 using a predefined compression metric, discussed further below. The multiple predictions from the plurality of predictor functions, $P_1$ through $P_N$, and the selected residual 340 are applied to a disambiguation function during step 320, as discussed further below in a section entitled "Disambiguation Criterion." The disambiguation function generates a disambiguation index, such as an index m, as discussed further below.

The remaining steps of FIG. 3 are performed in a similar manner as FIG. 2.

Combining RLS Predictors

In one or more embodiments, variations of the RLS algorithm are applied as the plurality of predictors. Define $RLS_{\lambda,\delta,p}$ as one RLS instance. Generally, several RLS instances are created by varying $\lambda$, $\delta$, and p linearly. During the compression, for each data sample, one prediction is generated with each RLS instance. The best predictor is selected as the one that yields the smallest residual, which is finally fed to the Minimal-Length algorithm as described above.

It can be shown that the strategy of choosing the best predictor for each sample potentially increases compression ratios by more than 50%, for example, depending on the "predictability" of the original data. The increased prediction quality, however, comes at the cost of bookkeeping which predictor was chosen for each sample, such that the data can be decompressed without loss. If N RLS instances are generated, a naïve approach incurs $\lceil \log_2 N \rceil$ bits of bookkeeping per sample, which renders the combination of predictors ineffective.

In one or more embodiments, the amount of bookkeeping required per sample is reduced by selecting only the RLS instances that minimize a predefined compression metric, and using a disambiguation criterion that allows an inference, during the decompression phase, of which predictor was used to compress each sample.

Compression Metric

Given a series of samples, $s_i$, a prediction function $P_j(s_i)=RLS_{\lambda_j,\delta_j,p_j}(s_i)$, $j=1 \ldots N$, and a residual $r_{ij}=P_j(s_i)-s_i$, let $$M_{ij}(r_{ij}) = \log_2\left(\frac{|r_{ij}|}{|s_i|}\right)$$

be a compression metric that indicates how many bits are potentially saved when using $r_{ij}$ in the compression instead of the original sample, $s_i$. Thus, for each sample of the series, the substantially best predictor is identified by analyzing the following expression:

$$\operatorname*{argmin}_{j} M_{ij}(r_{ij}),$$

which indicates, across all predictors, the one predictor that generated the residual that substantially minimizes the compression metric $M_{ij}$.

Disambiguation Criterion

In an ideal scenario, it is desirable to know, without any kind of bookkeeping, which predictor was used to predict each sample of the dataset. It is intuitive to imagine that, since the predictor that minimizes the compression metric is always chosen, the predictor can be inferred from the residual, $r_i$, directly. This could be done by "guessing" that, for a given sample, a certain predictor $P_b$ was selected as the best. Next, the original sample would be estimated as $\hat{s}_i = P_b(\hat{s}_i) + r_i$. An estimate of the residual of all other predictors $P_k$, $k \neq b$, could then be calculated as $\hat{r}_{ik} = P_k(\hat{s}_i) - \hat{s}_i$. If $P_b$ were indeed the best predictor, it could then be supposed that $M_{ik}(\hat{r}_{ik}) \geq M_{ib}(r_i)$, $\forall b$, and the predictor $P_b$ that satisfies this condition could be identified. In reality, however, inferring $P_b$ directly from the residual is not deterministic, since many $P_k$ might satisfy the condition for a large number of samples of the dataset, especially if residuals are small in magnitude.

Thus, one or more embodiments of the invention employ a disambiguation method to help infer the substantially best predictor with minimal bookkeeping. For this, define $\Pi_i$ as a set of (ambiguous) predictors that satisfy the inference condition above ($M_{ik}(\hat{r}_{ik}) \geq M_{ib}(r_i)$, $\forall k \neq b$) for sample $s_i$. Generally, the set of ambiguous predictors correspond to those predictors that could potentially be confused with the selected predictor.

FIG. 4A illustrates pseudo code for an exemplary implementation of a compression process 400 employing a disambiguation technique according to an embodiment of the invention. As shown in FIG. 4A, the residual is computed for each sample using each of the multiple predictors during step a, the compression metric is evaluated during step b to select a selected predictor, and the set of ambiguous predictors that satisfy the inference condition is initialized during step c to include the selected predictor.

The disambiguation method is implemented in step d to update the set of ambiguous predictors during step (iii) to include any ambiguous predictors. The disambiguation index, m, is updated and stored during step f to identify the best predictor in the set. Finally, the residual is compressed and stored during step g.

Figures 4B, 5:
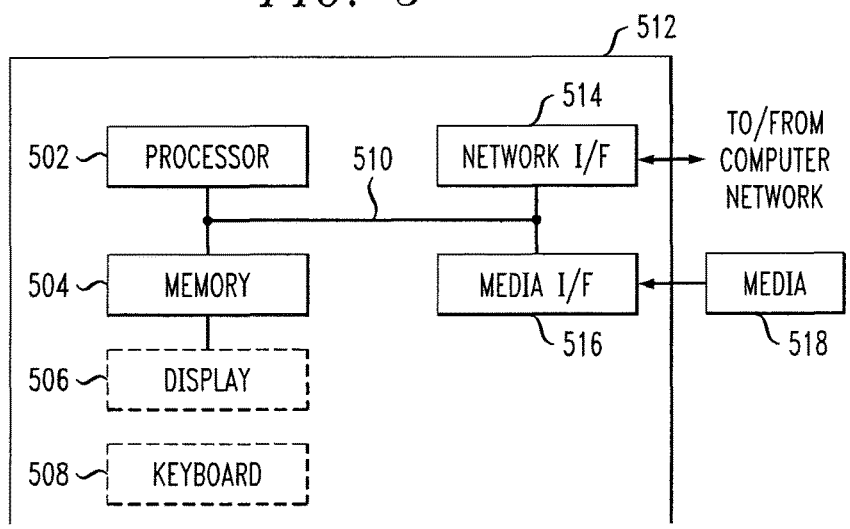

FIG. 4B illustrates pseudo code for an exemplary implementation of a decompression process 450 employing a disambiguation technique according to an embodiment of the invention. Generally, the decompression process 450 decompresses the compressed data in a straightforward manner, based on the discussion of the compression process 400 provided above.

As shown in FIG. 4B, the residual is read and decompressed during step a. The set of ambiguous predictors that satisfy the inference condition is initialized during step b to an empty set. The set of ambiguous predictors that satisfy the inference condition is rebuilt by the exemplary decompression process 450 during step c. Any predictor that satisfied the inference condition is added to the set during step c, iii. The best predictor is determined during step e using the stored disambiguation index, m, to read the best predictor from the rebuilt set of ambiguous predictors. Note that if the substantially best predictor is unambiguous, there will be only one predictor in the set, in which case the index m will be equal to zero. Finally, the sample is regenerated during step f using the best predictor for the sample and the stored residual.

Thus, both the compression process 400 and the decompression process 450 build the same set of ambiguous candidate predictors. In this way, it is possible to determine which predictors were ambiguous and to bookkeep which one of them was the best, using $nb=\lceil \log_2|\Pi_i|\rceil$ bits per sample, instead of the $\lceil \log_2 N \rceil$ bits of the referred naïve approach.

Best Combination of Predictors

Nevertheless, the disambiguation method tends to be less effective if the total number of predictors, N, is large, since many situations of ambiguity might arise. In one or more embodiments, a data compression method is provided that attempts to use the best RLS predictor to compress each sample of time series data, in particular, of seismic data. A combination of predictors can be selected that complement each other for a particular data set and, together, yield the best possible prediction on a sample by sample basis (e.g., fewer bits overall result when all residuals of the particular data set of floating point numbers are considered). Such a combination could include dozens of predictors, increasing the ability to obtain good predictions and high compression ratios.

One or more aspects of the invention recognize that choosing the best combination of $N_B$ predictors can be different than simply ranking them according to their individual overall performance.

In order to cope with this issue, only a subset of available predictors can optionally be used. Such subset is built by analyzing a statistically significant subset of the data during step 140, of size S, and defining, for each set of predictors $\Omega$, a global compression metric, as follows:

$$M_{set}(\Omega) = \frac{1}{S} \sum_{i=1}^{S} \left[ \left( \min_{j \in \Omega} M_{ij}(r_{ij}) \right) + \lceil \log_2|\Pi_i|\rceil \right],$$

where $\Pi_i$ corresponds to the ordered set of predictors from $\Omega$ that are ambiguous when the best prediction is chosen for each sample i, and $\lceil \log_2|\Pi_i|\rceil$ corresponds to the number of bits of bookkeeping (or the cost) that are necessary for disambiguation. Note that $\lceil \log_2|\Pi_i|\rceil=0$, $\forall i$, if only one predictor is used.

Assuming that the substantially best individual predictor will always be part of the best combination of predictors, a greedy algorithm is employed in one or more embodiments to build the set B of substantially best predictors. The set B of the best predictors for a certain dataset, out of the entire set of N predictors, having a predefined size $N_B$, is built as follows:

1.            $B = \underset{j}{\operatorname{argmin}}\, M_{set}(\{P_j\}),\, j = 1\, \ldots\, N$ 2. Repeat a.     $B = B \cup \left( \underset{k}{\operatorname{argmin}}\, M_{set}(B \cup \{P_k\}),\, k = 1\, \ldots\, N, k \notin B \right)$ 3. Until $|B|=N_B$ Step 1 above finds the best RLS configuration overall as the one that minimizes the sample-by-sample metric across all samples. Steps 2 to 3 incrementally find the RLS configuration that best complements the current best set of predictors, until the size of the resulting set reaches the pre-defined limit, $N_B$.

Note that this is a "brute force" method to find a set of predictors that at the same time minimize the average compression metric and the amount of bookkeeping. Despite being a computationally intensive method, it can be carried out as an initialization during step 140 on a small subset of the input data. Note also that the set B must be informed to the decompressor, so that it is capable of decompressing the samples with the same predictors used in the compression, without any data loss. The number of bits to inform the predictors of B tends to be negligible when compared to the typical size of seismic files, and does not affect the overall compression ratios.

Exploiting the Local Data Variance

Data analyses have further revealed strong correlations between groups of $RLS_{\lambda,\delta,p}$ predictors and the local variance of the time series. As used herein, "local variance" indicates the variance of the series' values along the past L samples. These correlations are expected, since predictions along data sections with large variance tend to be improved by using $RLS_{\lambda,\delta,p}$ instances that more easily adapt to noisy data. Such instances are usually those with low order (i.e., p is small).

The correlations found suggest that it is possible to group samples, using local variance ranges, and to generate different sets of RLS instances for different groups. The idea is to employ the combination of multiple predictors mentioned above for each variance range.

In practice, the variance ranges are applied to seismic traces, which are collections of samples stored in seismic files, having a direct connection with the depth of the area where the seismic acquisitions take place. In order to generate the variance ranges, it is necessary to define the number of segments. In one exemplary implementation, ranges containing 5% of the trace samples were established. In this case, there were 20 ranges per trace. Note that the size of the ranges is not uniform and that the sizes must be sent to the decompression algorithm as side information. Note also that many segments are typically assigned to the same range A. Compression With Best RLS for Each Variance Range In an initialization step (e.g., step 140), all variance ranges are computed from a small subset of seismic traces. Next, the best $RLS_{\lambda,\delta,p}$ instance for each variance range is found as the one that minimizes the average sample metric (defined above) of all samples in the range.

For the compression of a certain sample, its local variance is first computed from the past L samples. The variance range containing that computed variance is found and the associated best $RLS_{\lambda,\delta,p}$ instance is retrieved. A prediction is computed and the residual is supplied to the encoding algorithm, as detailed above.

The decompression of that same sample is basically the reverse operation. That is, the residual is retrieved from the compressed data and decoded. Next, the local variance is computed from the past L decompressed samples, the corresponding variance range is found and the best $RLS_{\lambda,\delta,p}$ is retrieved. The original sample is finally obtained as detailed above.

B. Combining RLS Predictors for Each Variance Range

In this approach, all of the above strategies are combined in order to locally optimize the predictions within each variance range. The idea is to build the set B of the best predictors for each variance range, using the disambiguation criterion to minimize the amount of bookkeeping per sample, as detailed above.

Namely, for each sample, the local variance is computed and the related variance range is found, as explained in the previous section. Instead of using the best single predictor for the range, a residual is obtained with the best RLS instance for that specific sample. Such instance is taken from the set of possible predictors computed for the variance range, during an initialization step. The residual is compressed as described above, and only $\lceil \log_2 |\Pi_i| \rceil \leq \lceil \log_2 N_B \rceil$ bits of bookkeeping are necessary to indicate which RLS instance was used, where $\Pi_i$ is the set of ambiguous predictors for the sample, as detailed above.

The decompression steps are, once again, the reverse of the compression steps. That is, a residual is obtained from the compressed data and the local variance of the sample being decompressed is computed. The related variance is found and the set of best RLS instances for the range is retrieved. The disambiguation criterion is employed and determines how many bits are necessary to identify the predictor used (i.e., $\lceil \log_2 |\Pi_i| \rceil$ bits). The original sample is finally computed with the RLS instance obtained with the bookkeeping information.

Conclusion

Aspects of the present invention are described herein with reference to flowchart illustrations and/or block diagrams of methods, apparatus (systems) and computer program products according to embodiments of the invention. It is to be appreciated that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As further described herein, such computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, as further detailed below, at least one embodiment of the invention includes an article of manufacture tangibly embodying computer readable instructions which, when implemented, cause a computer to carry out techniques described herein. An article of manufacture, a computer program product or a computer readable storage medium, as used herein, is not to be construed as being transitory signals, such as electromagnetic waves.

The computer program instructions may also be loaded onto a computer or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should be noted that the functions noted in the block may occur out of the order noted in the figures.

Accordingly, the techniques described herein can include providing a system, wherein the system includes distinct software modules, each being embodied on a tangible computer-readable recordable storage medium (for example, all modules embodied on the same medium, or each modules embodied on a different medium). The modules can run, for example, on a hardware processor, and the techniques detailed herein can be carried out using the distinct software modules of the system executing on a hardware processor.

Additionally, the techniques detailed herein can also be implemented via a computer program product that includes computer useable program code stored in a computer readable storage medium in a data processing system, wherein the computer useable program code was downloaded over a network from a remote data processing system. The computer program product can also include, for example, computer useable program code that is stored in a computer readable storage medium in a server data processing system, wherein the computer useable program code is downloaded over a network to a remote data processing system for use in a computer readable storage medium with the remote system.

As will be appreciated by one skilled in the art, aspects of the present invention may take the form of an entirely hardware embodiment, an entirely software embodiment (including firmware, resident software, micro-code, etc.) or an embodiment combining software and hardware aspects that may all generally be referred to herein as a "module" or "system."

An aspect of the invention or elements thereof can be implemented in the form of an apparatus including a memory and at least one processor that is coupled to the memory and operative to perform the techniques detailed herein. Also, as described herein, aspects of the present invention may take the form of a computer program product embodied in a computer readable medium having computer readable program code embodied thereon.

By way of example, an aspect of the present invention can make use of software running on a general purpose computer. FIG. 5 is a system diagram of an exemplary computer system on which at least one embodiment of the invention can be implemented. As depicted in FIG. 5, an example implementation employs, for example, a processor 502, a memory 504, and an input/output interface formed, for example, by a display 506 and a keyboard 508. The term "processor" as used herein includes any processing device(s), such as, for example, one that includes a central processing unit (CPU) and/or other forms of processing circuitry. The term "memory" includes memory associated with a processor or CPU, such as, for example, random access memory (RAM), read only memory (ROM), a fixed memory device (for example, a hard drive), a removable memory device (for example, a diskette), a flash memory, etc. Further, the phrase "input/output interface," as used herein, includes a mechanism for inputting data to the processing unit (for example, a mouse) and a mechanism for providing results associated with the processing unit (for example, a printer).

The processor 502, memory 504, and input/output interface such as display 506 and keyboard 508 can be interconnected, for example, via bus 510 as part of a data processing unit 512. Suitable interconnections via bus 510, can also be provided to a network interface 514 (such as a network card), which can be provided to interface with a computer network, and to a media interface 516 (such as a diskette or compact disc read-only memory (CD-ROM) drive), which can be provided to interface with media 518.

Accordingly, computer software including instructions or code for carrying out the techniques detailed herein can be stored in associated memory devices (for example, ROM, fixed or removable memory) and, when ready to be utilized, loaded in part or in whole (for example, into RAM) and implemented by a CPU. Such software can include firmware, resident software, microcode, etc.

As noted above, a data processing system suitable for storing and/or executing program code includes at least one processor 502 coupled directly or indirectly to memory elements 504 through a system bus 510. The memory elements can include local memory employed during actual implementation of the program code, bulk storage, and cache memories which provide temporary storage of at least some program code in order to reduce the number of times code must be retrieved from bulk storage during implementation. Also, input/output (I/O) devices such as keyboards 508, displays 506, and pointing devices, can be coupled to the system either directly (such as via bus 510) or through intervening I/O controllers.

Network adapters such as network interface 514 (for example, a modem, a cable modem or an Ethernet card) can also be coupled to the system to enable the data processing system to become coupled to other data processing systems or remote printers or storage devices through intervening private or public networks.

As used herein, a "server" includes a physical data processing system (such as system 512 as depicted in FIG. 5) running a server program. It will be understood that such a physical server may or may not include a display and keyboard.

As noted, at least one embodiment of the invention can take the form of a computer program product embodied in a computer readable medium having computer readable program code embodied thereon. As will be appreciated, any combination of computer readable media may be utilized. The computer readable medium can include a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Examples include an electrical connection having one or more wires, a portable computer diskette, a hard disk, RAM, ROM, an erasable programmable read-only memory (EPROM), flash memory, an optical fiber, a portable CD-ROM, an optical storage device, a magnetic storage device, and/or any suitable combination of the foregoing. More generally, a computer readable storage medium may be any tangible medium that can contain, or store a program for use by or in connection with an instruction execution system, apparatus, or device.

Additionally, a computer readable signal medium may include a propagated data signal with computer readable program code embodied therein, for example, in baseband or as part of a carrier wave. Such a propagated signal may take any of a variety of forms such as, for example, electromagnetic, optical, or a suitable combination thereof. More generally, a computer readable signal medium may be any computer readable medium that is not a computer readable storage medium and that can communicate, propagate, or transport a program for use by or in connection with an instruction execution system, apparatus, or device.

Program code embodied on a computer readable medium can be transmitted using an appropriate medium such as, for example, wireless, wireline, optical fiber cable, radio frequency (RF), and/or a suitable combination of the foregoing. Computer program code for carrying out operations in accordance with one or more embodiments of the invention can be written in any combination of at least one programming language, including an object oriented programming language, and conventional procedural programming languages. The program code may execute entirely on a user's computer, partly on a user's computer, as a stand-alone software package, partly on a user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In light of the above descriptions, it should be understood that the components illustrated herein can be implemented in various forms of hardware, software, or combinations thereof, for example, application specific integrated circuit (s) (ASICS), functional circuitry, an appropriately programmed general purpose digital computer with associated memory, etc.

Terminology used herein is for the purpose of describing particular embodiments only and is not intended to be limiting of the invention. For example, the singular forms "a," "an" and "the" are intended to include the plural forms as well, unless clearly indicated otherwise. It will be further understood that the terms "comprises" and/or "comprising," as used herein, specify the presence of stated features, integers, steps, operations, elements, and/or components, but do not preclude the presence or addition of another feature, integer, step, operation, element, component, and/or group thereof. Additionally, the corresponding structures, materials, acts, and equivalents of all means or step plus function elements in the claims are intended to include any structure, material, or act for performing the function in combination with other claimed elements as specifically claimed.

Also, it should again be emphasized that the above-described embodiments of the invention are presented for purposes of illustration only. Many variations and other alternative embodiments may be used. For example, the techniques are applicable to a wide variety of other types of communication systems, storage systems and processing devices that can benefit from improved decompression of seismic data. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method for compressing at least one floating point number, comprising the steps of:
obtaining said at least one floating point number represented using one or more bits to indicate a sign of said at least one floating point number and one or more additional bits to indicate an exponent at a given base and a significand of said at least one floating point number, wherein said significand has a length equal to a number of bits between a most significant bit of said significand and a least significant bit of said significand having a predefined binary value;

applying, using at least one processing device, a plurality of distinct prediction algorithms to said at least one floating point number to generate a corresponding plurality of predictions;

selecting, using the at least one processing device, a given one of said plurality of distinct prediction algorithms for said at least one floating point number by evaluating a compression metric applied to said plurality of predictions; and encoding, using the at least one processing device, said at least one floating point number by encoding said exponent and said length as a single code using a residual generated by said selected prediction algorithm.

2. The method of claim 1, wherein said compression metric is related to selecting said given one of said plurality of predictions that generates a residual of smallest magnitude and a largest bit saving in a number of bits to be encoded.

3. The method of claim 1, further comprising the step of storing an indication of said selected prediction algorithm.

4. The method of claim 3, wherein said indication comprises a disambiguation index identifying said selected prediction algorithm among a set of potential prediction algorithms that potentially generated said selected prediction.

5. The method of claim 4, wherein said set of potential prediction algorithms is generated by discarding one or more predictions that, when added to said residual, correspond to a floating point number for which a better prediction algorithm results in another residual with fewer bits.

6. The method of claim 3, further comprising the step of decompressing said compressed given floating point number by restoring discarded bits based on said encoded length and said stored indication.

7. The method of claim 1, further comprising the step of determining a set of one or more predictors out of a larger set of predictors for a specific data set including said at least one floating point number based on a performance-based ranking.

8. The method of claim 7, wherein said performance-based ranking selects the predictors in the set of predictors based on an extent that the selected predictors complement one another such that fewer bits result overall when residuals of a set of said floating point numbers are considered.

9. The method of claim 7, wherein said set of one or more predictors is selected for a segment of said data set including said at least one floating point number, wherein said data set is segmented based on one or more of a local variance, a local average, a local measure of smoothness and a local auto-correlation.

10. The method of claim 9, further comprising the step of storing a disambiguation index indicating one selected prediction algorithm from among the set of predictors selected for said segment.

11. The method of claim 10, further comprising the step of decompressing said compressed given floating point number by restoring discarded bits based on said encoded length and said disambiguation index, considering the set of predictors selected for said segment to which said compressed given floating point number belongs.

12. A computer program product for compressing at least one floating point number, comprising a tangible machine-readable storage medium having encoded therein executable code of one or more software programs, wherein the one or more software programs when executed by at least one processing device perform the following steps:

obtaining said at least one floating point number represented using one or more bits to indicate a sign of said at least one floating point number and one or more additional bits to indicate an exponent at a given base and a significand of said at least one floating point number, wherein said significand has a length equal to a number of bits between a most significant bit of said significand and a least significant bit of said significand having a predefined binary value;

applying, using at least one processing device, a plurality of distinct prediction algorithms to said at least one floating point number to generate a corresponding plurality of predictions;

selecting, using the at least one processing device, a given one of said plurality of distinct prediction algorithms for said at least one floating point number by evaluating a compression metric applied to said plurality of predictions; and encoding, using the at least one processing device, said at least one floating point number by encoding said exponent and said length as a single code using a residual generated by said selected prediction algorithm.

13. The computer program product of claim 12, wherein said compression metric is related to selecting said given one of said plurality of predictions that generates a residual of smallest magnitude and a largest bit saving in a number of bits to be encoded.

14. The computer program product of claim 12, further comprising the step of storing an indication of said selected prediction algorithm.

15. The computer program product of claim 12, further comprising the step of determining a set of one or more predictors out of a larger set of predictors for a specific data set including said at least one floating point number based on a performance-based ranking.

16. A system for compressing at least one floating point number, comprising:

a memory; and at least one processing device, coupled to the memory, operative to implement the following steps:

obtaining said at least one floating point number represented using one or more bits to indicate a sign of said at least one floating point number and one or more additional bits to indicate an exponent at a given base and a significand of said at least one floating point number, wherein said significand has a length equal to a number of bits between a most significant bit of said significand and a least significant bit of said significand having a predefined binary value;

applying, using the at least one processing device, a plurality of distinct prediction algorithms to said at least one floating point number to generate a corresponding plurality of predictions;

selecting, using the at least one processing device, a given one of said plurality of distinct prediction algorithms for said at least one floating point number by evaluating a compression metric applied to said plurality of predictions; and encoding, using the at least one processing device, said at least one floating point number by encoding said exponent and said length as a single code using a residual generated by said selected prediction algorithm.

17. The system of claim 16, wherein said compression metric is related to selecting said given one of said plurality of predictions that generates a residual of smallest magnitude and a largest bit saving in a number of bits to be encoded.

18. The system of claim 16, further comprising the step of storing an indication of said selected prediction algorithm.

19. The system of claim 18, wherein said indication comprises a disambiguation index identifying said selected prediction algorithm among a set of potential prediction algorithms that potentially generated said selected prediction.

20. The system of claim 18, further comprising the step of decompressing said compressed given floating point number by restoring discarded bits based on said encoded length and said stored indication.

21. The system of claim 16, further comprising the step of determining a set of one or more predictors out of a larger set of predictors for a specific data set including said at least one floating point number based on a performance-based ranking.

22. The system of claim 21, wherein said set of one or more predictors is selected for a segment of said data set including said at least one floating point number, wherein said data set is segmented based on one or more of a local variance, a local average, a local measure of smoothness and a local auto-correlation.

* * * * *